(12) United States Patent
Chen et al.

(10) Patent No.: US 8,759,848 B2
(45) Date of Patent: Jun. 24, 2014

(54) LIGHT-EMITTING DEVICE

(75) Inventors: Chao-Hsing Chen, Hsinchu (TW); Chien-Kai Chung, Hsinchu (TW); Hsin-Mao Liu, Hsinchu (TW); Chiu-Lin Yao, Hsinchu (TW); Chien-Fu Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/545,354

(22) Filed: Jul. 10, 2012

(65) Prior Publication Data

US 2013/0015473 A1      Jan. 17, 2013

(30) Foreign Application Priority Data

Jul. 13, 2011   (TW) .............................. 100124903 A

(51) Int. Cl.
*H01L 33/08*   (2010.01)
*H01L 25/075*  (2006.01)
*H01L 33/62*   (2010.01)
*H01L 33/38*   (2010.01)

(52) U.S. Cl.
CPC ............ *H01L 25/0753* (2013.01); *H01L 33/62* (2013.01); *H01L 33/385* (2013.01)
USPC .................. 257/88; 257/89; 257/98; 257/99; 257/E33.062; 438/22; 438/25

(58) Field of Classification Search
CPC ..... H01L 33/60; H01L 33/20; H01L 25/0756; H01L 33/32; H01L 25/0753; H01L 27/153; H01L 33/62; H01L 33/38; F21K 9/00
USPC ....... 257/88, 89, 98, 99, E33.062; 438/22, 25
See application file for complete search history.

(56) References Cited

U.S. PATENT DOCUMENTS 6,635,902 B1 *   10/2003   Lin ................................. 257/88

* cited by examiner

*Primary Examiner* — Thinh T Nguyen
(74) *Attorney, Agent, or Firm* — Patterson & Sheridan, LLP

(57) ABSTRACT

The application provides a light-emitting device, comprising a substrate; a plurality of first light-emitting diode units on the substrate, wherein every first light-emitting diode unit has a first electrode structure; and a plurality of second light-emitting diode units among the plurality of first light-emitting diode units, wherein every second light-emitting diode unit has a second electrode structure. The second electrode structure of the second light-emitting diode unit is flipped over and electrically connected with the adjacent first electrode structure of the first light-emitting diode unit.

20 Claims, 4 Drawing Sheets

US 8,759,848 B2

LIGHT-EMITTING DEVICE

RELATED APPLICATIONS

The present application claims the right of priority based on Taiwan Patent Application No. 100124903 entitled "LIGHT-EMITTING DEVICE", filed on Jul. 13, 2011, and is incorporated herein by reference in its entirety and assigned to the assignee herein.

TECHNICAL FIELD

The present application relates to a light-emitting device and the manufacture method thereof.

BACKGROUND

The light emitting theorem and structure of the light-emitting diode (LED) are different from the traditional light source. It has advantages such as less power consumption, longevous, short warming time, fast response speed, and small volume, vibration resistance, suitable to mass production, easy to satisfy the requirements of applications to produce tiny or array device. LEDs have been adopted widely in the market such as optical display device, laser diode, traffic signal, data storage device, communication device, illumination device, and medical treatment device.

SUMMARY

The application provides a light-emitting device, comprising a substrate; a plurality of first light-emitting diode units on the substrate, wherein every first light-emitting diode unit has a first electrode structure; and a plurality of second light-emitting diode units among the plurality of first light-emitting diode units, wherein every second light-emitting diode unit has a second electrode structure; wherein the second electrode structure of the second light-emitting diode unit is flipped over and electrically connected with the adjacent first electrode structure of the first light-emitting diode unit. The application provides a light-emitting device, wherein the first electrode structure and the second electrode structure respectively comprise a first electrical electrode and a second electrical electrode. Wherein the first electrical electrode of the second electrode structure in every of the second light-emitting diode units connects with the adjacent second electrical electrode of the first electrode structure in every of the first light-emitting diode units; the second electrical electrode of the second electrode structure in every of the second light-emitting diode units connects with the adjacent first electrical electrode of the first electrode structure in every of the first light-emitting diode units.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein.

DETAILED DESCRIPTION OF THE PREFERRED EMBODIMENTS

Figure 1:
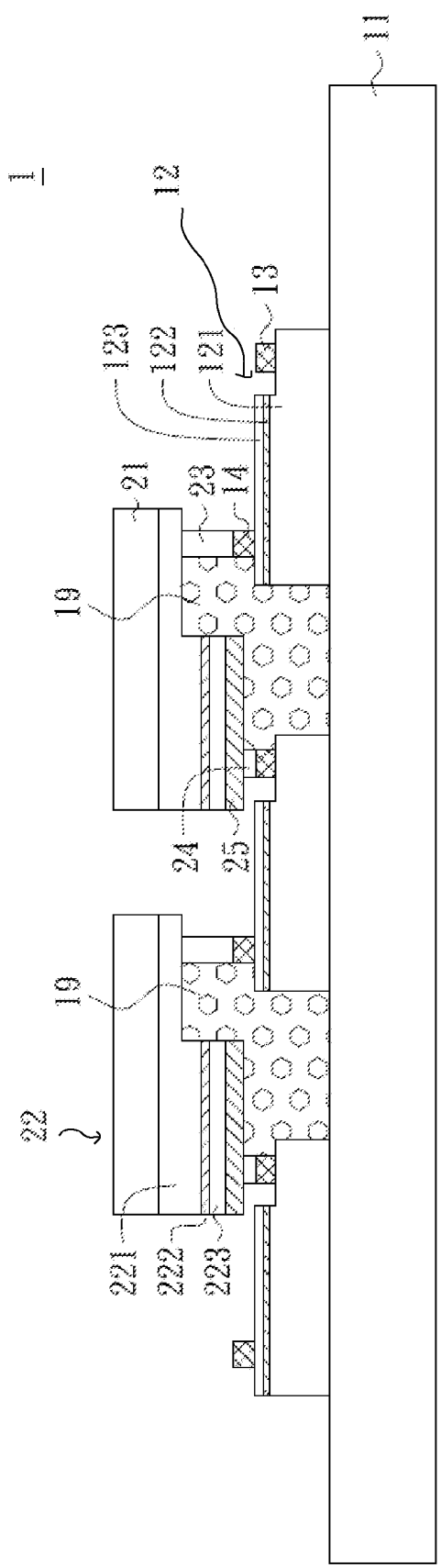
FIG. 1 is a diagram of a light-emitting diode structure in accordance with the first embodiment of the present application.

First, as FIG. 1 shows, the first embodiment of the present application provides a light-emitting device 1. The light-emitting device 1 comprises a growth substrate 11, and a plurality of first light-emitting diode units 12 epitaxially grown from the growth substrate. There are three first light-emitting diode units 12 in this embodiment, while the number is not limited to three in other embodiments. Each of the first light-emitting diode units 12 comprises a first conductivity type semiconductor layer 121, an active layer 122, and a second conductivity type semiconductor layer 123. Partial of the second conductivity type semiconductor layer 123, the active layer 122, and the first conductivity type semiconductor layer 121 are sequentially etched to expose part of the first conductivity type semiconductor layer 121, then a first electrical electrode 13 and a second electrical electrode 14 are formed on the exposed surface of the first conductivity type semiconductor layer 121 and on the second conductivity type semiconductor layer 123 respectively, wherein the first electrical electrode 13 and the second electrical electrode 14 form a first electrode structure of the first light-emitting diode units 12. A plurality of second light-emitting diode units 22 is epitaxially grown directly on another growth substrate 21 while there are two second light-emitting diode units 22 in this embodiment. Each of the second light-emitting diode units 22 comprises a first conductivity type semiconductor layer 221, an active layer 222, and a second conductivity type semiconductor layer 223. Partial of the second conductivity type semiconductor layer 223, the active layer 222, and the first conductivity type semiconductor layer 221 are sequentially etched to expose part of the first conductivity type semiconductor layer 221. In order to increase the luminous efficiency of the second light-emitting diode units 22, a reflecting structure 25 can be respectively formed on the second conductivity type semiconductor layer 223 optionally, such as a metal reflecting layer or a distributed Bragg reflector, then a first electrical electrode 23 and a second electrical electrode 24 are formed on an exposed surface of the first conductivity type semiconductor layer 221 and on the reflecting structure 25 respectively, wherein the first electrical electrode 23 and the second electrical electrode 24 form a second electrode structure of the second light-emitting diode units 22. A plurality of second light-emitting diode units is separated by dicing process. A plurality of intervals is formed among the plurality of first light-emitting diode units, and the intervals are smaller than a length of one side of any second light-emitting diode units 22.

The second electrode structure of every second light-emitting diode units 22 respectively connects with the first electrode structure of the adjacent first light-emitting diode units 12 by flip-bonding, that is, the first electrical electrode 23 of the second light-emitting diode unit 22 connects with the second electrical electrode 14 of a first light-emitting diode unit 12, the second electrical electrode 24 of the second light-emitting diode unit 22 electrically connects with the first electrical electrode 13 of another first light-emitting diode unit 12 to form a serial connection. An underfill 19 comprising an insulating material is formed between the plurality of second light-emitting diode units 22 and the growth substrate 11, wherein the underfill can be an anisotropic conductive glue in the embodiment. Finally, a light-emitting device is formed as a single chip having a side length between 0.5 mm and 5 mm. The material of the growth substrate 11, 21 can comprise germanium, gallium arsenic, indium phosphide, sapphire, silicon carbide, silicon, lithium aluminum oxide, zinc oxide, gallium nitride, and aluminum nitride. The material of the first light-emitting diode units 12 and the second light-emitting diode units 22 can comprise AlGaInP series compound or AlInGaN series compound. A dominant wavelength emitted from the active layer 122 of each of the first light-emitting diode units 12 can be about the same with or the different from that of the light emitted from the active layer 222 of any of the second light-emitting diode units 22, and a peak wavelength emitted from the active layer 222 of each of the second light-emitting diode units 22 can be about the same with or different from each other while the peak wavelength emitted from the active layer 122 of each of the first light-emitting diode units 12 is about the same with each other. A sidewall of any of the first light-emitting diode units 12 and/or any of the second light-emitting diode units 22 can be a non-vertical incline (not shown).

Figure 2:
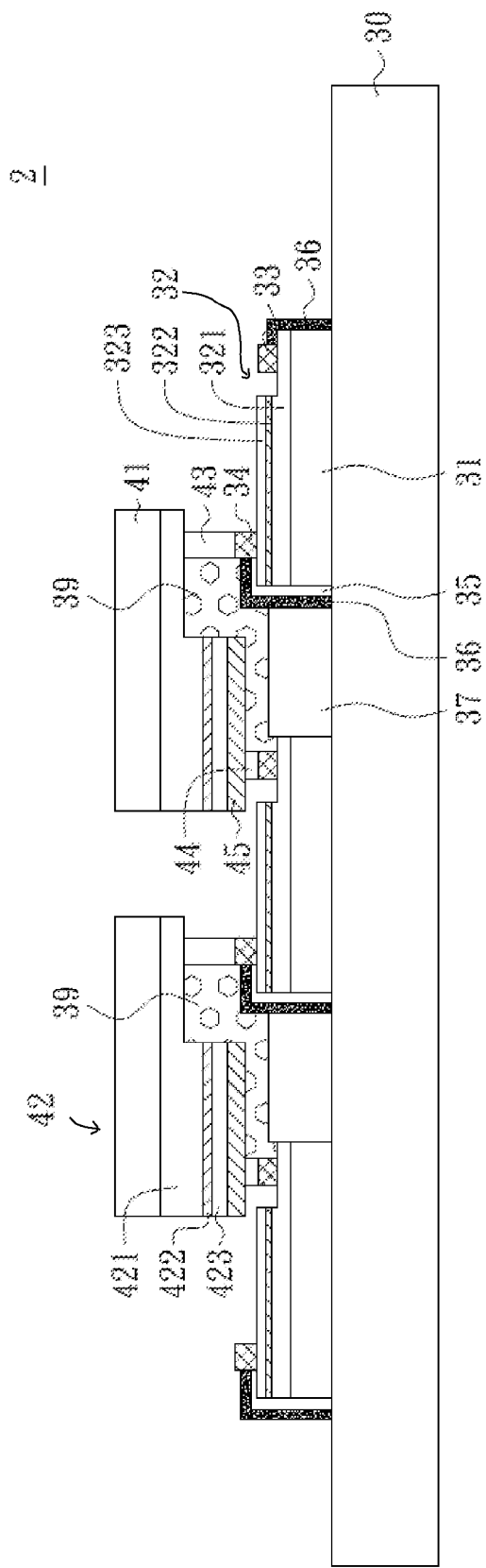
FIG. 2 is a diagram of a light-emitting diode structure in accordance with the second embodiment of the present application.

As FIG. 2 shows, the second embodiment of the present application provides a light-emitting device 2. A growth substrate 31 is provided, and a plurality of first light-emitting diode units 32 is epitaxially grown on the growth substrate. There are three first light-emitting diode units 32 in this embodiment, while the number is not limited to three in other embodiments. Each of the first light-emitting diode units 32 comprises a first conductivity type semiconductor layer 321, an active layer 322, and a second conductivity type semiconductor layer 323. Partial of the second conductivity type semiconductor layer 323, the active layer 322, and the first conductivity type semiconductor layer 321 are sequentially etched to expose part of the first conductivity type semiconductor layer 321. Then a first electrical electrode 33 and a second electrical electrode 34 are formed on the exposed surface of the first conductivity type semiconductor layer 321 and on the second conductivity type semiconductor layer 323 respectively, wherein the first electrical electrode 33 and the second electrical electrode 34 form a first electrode structure of the first light-emitting diode units 32. A plurality of first light-emitting diode units is separated by dicing process. A plurality of second light-emitting diode units 42 is epitaxially grown on another growth substrate 41 while there are two second light-emitting diode units 42 in this embodiment. Each of the second light-emitting diode units 42 comprises a first conductivity type semiconductor layer 421, an active layer 422, and a second conductivity type semiconductor layer 423. Partial of the second conductivity type semiconductor layer 423, the active layer 422, and the first conductivity type semiconductor layer 421 are sequentially etched to expose part of the first conductivity type semiconductor layer 421. In order to increase the luminous efficiency of the second light-emitting diode units 42, a reflecting structure 45 can be respectively formed on the second conductivity type semiconductor layer 423 optionally, such as a metal reflecting layer or a distributed Bragg reflector, then a first electrical electrode 43 and a second electrical electrode 44 are formed on an exposed surface of the first conductivity type semiconductor layer 421 and on the reflecting structure 45 respectively, wherein the first electrical electrode 43 and the second electrical electrode 44 form a second electrode structure of the second light-emitting diode units 42. A plurality of second light-emitting diode units is separated by dicing process.

The material of the growth substrate 31, 41 can comprise germanium, gallium arsenic, indium phosphide, sapphire, silicon carbide, silicon, lithium aluminum oxide, zinc oxide, gallium nitride, and aluminum nitride. The material of the first light-emitting diode units 32 and the second light-emitting diode units 42 can comprise AlGaInP series compound or AlInGaN series compound. A dominant wavelength emitted from the active layer 322 of each of the first light-emitting diode units 32 can be about the same with or the different from that of the light emitted from the active layer 422 of any of the second light-emitting diode units 42, and a peak wavelength emitted from the active layer 422 of each of the second light-emitting diode units 42 can be the same with or different from each other while the peak wavelength emitted from the active layer 322 of each of the first light-emitting diode units 32 is about the same with or different form each other. A sidewall of any of the first light-emitting diode units 32 and/or any of the second light-emitting diode units 42 can be a non-vertical incline (not shown). A carrier substrate 30 is provided and it can be a print circuit board, a soft substrate, an aluminum substrate, a ceramic substrate, or a copper substrate. The plurality of first light-emitting diode units 32 is formed on the carrier substrate 30, and the first electrode structure electrically connects with a circuit of the carrier substrate (not shown) by an electrical connecting structure 36. A plurality of intervals is formed among the plurality of first light-emitting diode units, and the intervals are smaller than a length of one side of any second light-emitting diode units 42. In this embodiment, the length of one side is between 0.1 mm and 2 mm. A first insulating structure 37 is formed among the plurality of intervals, wherein the height of the first insulating structure 37 is smaller than or equal to the height of the any one first light-emitting diode units, and a second insulating structure 35 is formed on a sidewall adjacent to the first insulating structure 37 of the first light-emitting diode units 32. Another electrical connecting structure 36 is formed between the first insulating structure 37 and the second insulating structure 35, wherein the material of the first insulating structure 37 and the second insulating structure 35 is the same or different.

The second electrode structure of every second light-emitting diode units 42 respectively connects with the first electrode structure of the adjacent first light-emitting diode units 32 by flip-bonding, that is, the first electrical electrode 43 of the second light-emitting diode unit 42 connects with the second electrical electrode 34 of a first light-emitting diode unit 32, the second electrical electrode 44 of the second light-emitting diode unit 42 electrically connects with the first electrical electrode 33 of another first light-emitting diode unit 32 to form a serial connection. An underfill 39 comprising an insulating material is formed between the plurality of second light-emitting diode units 42 and the first insulating structure 37, wherein the underfill can be an anisotropic conductive glue or the same with the material of the first insulating structure 37 in the embodiment.

Figure 3:
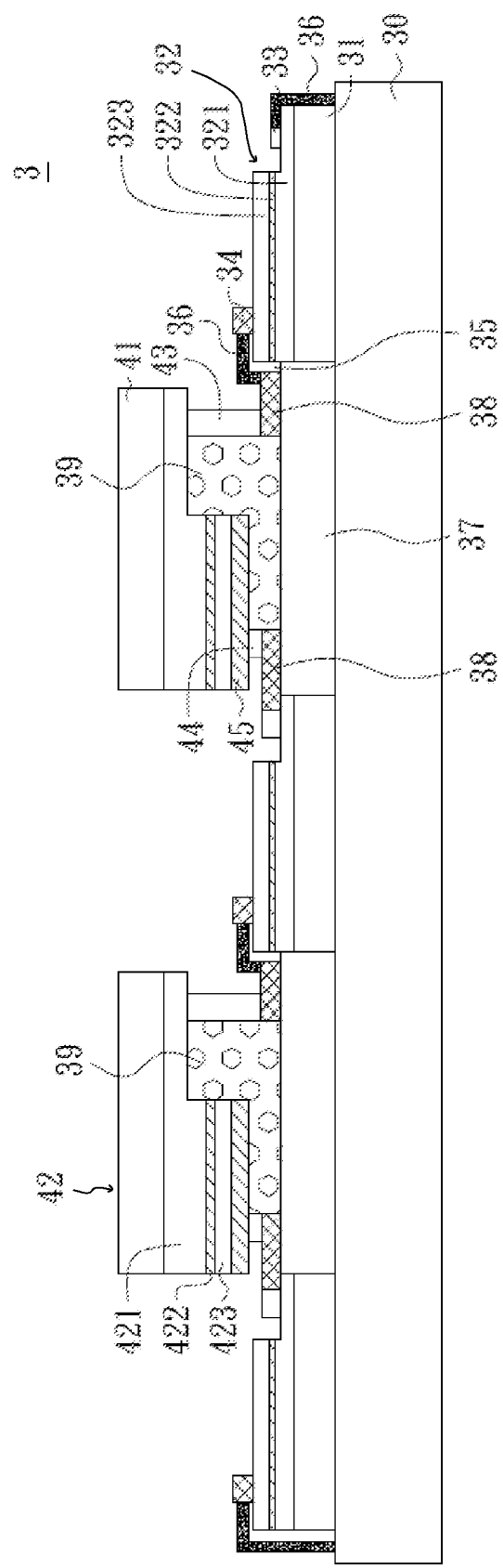
FIG. 3 is a diagram of a light-emitting diode structure in accordance with the third embodiment of the present application.

As FIG. 3 shows, the third embodiment of the present application provides a light-emitting device 3. A plurality of intervals is formed among the plurality of first light-emitting diode units 32 which is different from the second embodiment, but the intervals are greater than a length of one side of any second light-emitting diode units 42. In this embodiment, the length of one side is between 0.25 mm and 5 mm. A first insulating structure 37, a second insulating structure 35, and an underfill 39 are formed among the plurality of intervals, and a plurality of extending electrode structure 38 is formed on the first insulating structure 37. The second electrode structure of every second light-emitting diode units 42 respectively connects with the first electrode structure of the adjacent first light-emitting diode units 32 by flip-bonding with the plurality of extending electrode structure 38 and the plurality of electrical connecting structure 36, that is, the first electrical electrode 43 of the second light-emitting diode unit 42 connects with the second electrical electrode 34 of a first light-emitting diode unit 32 by the plurality of extending electrode structure 38 and the plurality of electrical connecting structure 36, and the second electrical electrode 44 of the second light-emitting diode unit 42 electrically connects with the first electrical electrode 33 of another first light-emitting diode unit 32 to form a serial connection by the plurality of extending electrode structure 38.

Figure 4:
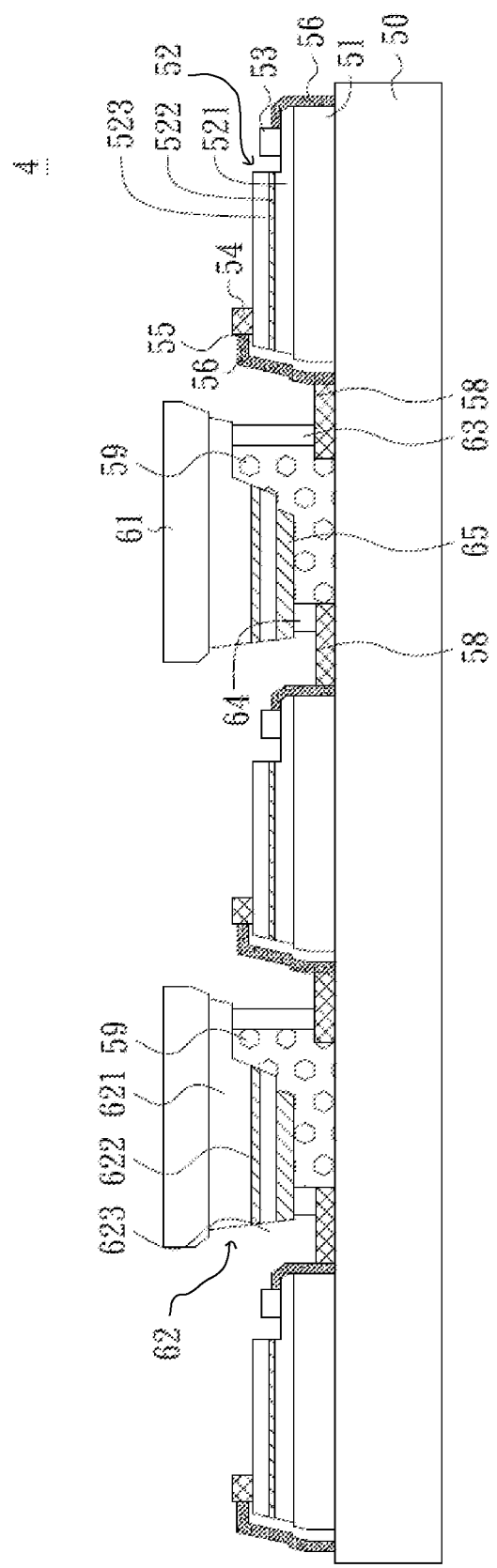
FIG. 4 is a diagram of a light-emitting diode structure in accordance with the fourth embodiment of the present application.

As FIG. 4 shows, the fourth embodiment of the present application provides a light-emitting device 4. The plurality of first light-emitting diode units 52 and a plurality of second light-emitting diode units 62 are epitaxialy grown on a growth substrate 51, 61 respectively, and the material of the growth substrate and the material of the light-emitting diode units are the same with the second embodiment. A carrier substrate 50 is provided and it can be a print circuit board, a soft substrate, an aluminum substrate, a ceramic substrate, or a copper substrate. The plurality of first light-emitting diode units 52 is formed on the carrier substrate 50, and a first electrical electrode 53 and a second electrical electrode 54 of the first electrode structure electrically connects with a circuit of the carrier substrate (not shown) by an electrical connecting structure 56. A plurality of intervals is formed among the plurality of first light-emitting diode units, and the intervals are greater than a length of one side of any second light-emitting diode units 62. In this embodiment, the length of one side is between 0.25 mm and 5 mm. A plurality of extending electrode structure 58 is formed in the plurality of intervals, and a plurality of second light-emitting diode units 62 is formed in the plurality of intervals by flip-bonding. The second electrode structure of every second light-emitting diode units 62 respectively connects with the first electrode structure of the adjacent first light-emitting diode units 52 by the plurality of extending electrode structure 58 and the plurality of electrical connecting structure 56, that is, the first electrical electrode 63 of the second light-emitting diode unit 62 connects with the second electrical electrode 54 of the first light-emitting diode unit 52 by the plurality of extending electrode structure 58 and the plurality of electrical connecting structure 56, and the second electrical electrode 64 of the second light-emitting diode unit 62 electrically connects with the first electrical electrode 53 of another first light-emitting diode unit 52 to form a serial connection by the plurality of extending electrode structure 58 and the plurality of electrical connecting structure 56. A second insulating structure 55 is formed between the electrical connecting structure 56 and the plurality of first light-emitting diode units 52, and an underfill 59 comprising an insulating material is formed between the plurality of second light-emitting diode units 62 and the extending electrode structure 58, wherein the underfill can be an anisotropic conductive glue in the embodiment. A sidewall of any of the first light-emitting diode units 52 and/or any of the second light-emitting diode units 62 can be a non-vertical incline (not shown).

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
    a substrate;
    a plurality of first light-emitting diode units on the substrate, wherein every first light-emitting diode unit has a first electrode structure; and
    a plurality of second light-emitting diode units among the plurality of first light-emitting diode units, wherein every second light-emitting diode unit has a second electrode structure;
    wherein the second electrode structure of the second light-emitting diode unit is flipped over and electrically connected with the adjacent first electrode structure of the first light-emitting diode unit.

2. The light-emitting device according to claim 1, wherein the substrate is a growth substrate.

3. The light-emitting device according to claim 1, wherein the substrate is a carrier substrate which can be a print circuit board, a soft substrate, an aluminum substrate, a ceramic substrate, or a copper substrate.

4. The light-emitting device according to claim 1, further comprising a plurality of intervals among the plurality of first light-emitting diode units.

5. The light-emitting device according to claim 1, wherein at least one of the first light-emitting diode units and one of the second light-emitting diode units each comprises:
    a first conductivity type semiconductor layer;
    a second conductivity type semiconductor layer; and
    an active layer formed between the first conductivity type semiconductor layer and the second conductivity type conductor layer, wherein for the one of the first light-emitting diode units, the first conductivity type semiconductor layer is between the substrate and the first electrode structure, and for the one of the second light-emitting diode units, the second electrode structure is between the first conductivity type semiconductor layer and the substrate.

6. The light-emitting device according to claim 5, wherein a dominant wavelength emitting from any of the plurality of first light-emitting diode units is different from a dominant wavelength emitting from any of the plurality of second light-emitting diode units.

7. The light-emitting device according to claim 1, further comprising an underfill between the plurality of second light-emitting diode units and the substrate, wherein the underfill comprises an insulating material.

8. The light-emitting device according to claim 1, further comprising an underfill between the plurality of second light-emitting diode units and the substrate, wherein the underfill is an anisotropic conductive glue.

9. The light-emitting device according to claim 2, wherein the light-emitting device is a single chip having a side length between 0.5 mm and 5 mm.

10. The light-emitting device according to claim 1, wherein a sidewall of any of the first light-emitting diode units and/or any of the second light-emitting diode units comprises a non-vertical incline.

11. The light-emitting device according to claim 1, wherein each of the first electrode stucture and the second electrode structure comprises a first electrical electrode and a second electrical electrode, and one of the first electrical electrodes of the second light-emitting diode units electrically connects with the adjacent second electrical electrode of one of the first light-emitting diode units.

12. The light-emitting device according to claim 3, wherein the plurality of first light-emitting diode units further comprising a plurality of electrical connecting structures, wherein the plurality of first light-emitting diode units electrically connects with the substrate by the electrical connecting structures.

13. The light-emitting device according to claim 4, wherein a width of one of the intervals are smaller than a length of one side of the plurality of second light-emitting diode units.

14. The light-emitting device according to claim 4, wherein a width of one of the intervals are greater than a length of one side of the plurality of second light-emitting diode units.

15. The light-emitting device according to claim 4, wherein a width of one of the intervals is between 0.1 mm and 2 mm, or between 0.25 mm and 5 mm.

16. The light-emitting device according to claim 4, wherein the plurality of second light-emitting diode units is formed in the intervals.

17. The light-emitting device according to claim 4, wherein each of the intervals comprise a first insulating structure, and a height of the first insulating structure is smaller than or equal to the height of any one of the first light-emitting diode units.

18. The light-emitting device according to claim 17, further comprising one extending electrode structure on the first insulating structure, wherein the second electrode structure of one of the second light-emitting diode unit electrically connects with the adjacent first electrode structure of one of the first light-emitting diode unit by the extending electrode structure.

19. The light-emitting device according to claim 5, wherein the one of the first light-emitting diode units further comprises a second substrate between the first conductivity type semiconductor layer and the substrate.

20. The light-emitting device according to claim 5, wherein the one of the second light-emitting diode units further comprises a second substrate, and the second electrode structure is between the substrate and the second substrate.

* * * * *